(12) United States Patent
Mitsui (10) Patent No.: US 6,588,946 B1
(45) Date of Patent: Jul. 8, 2003

(54) OPTICAL COUPLING DEVICE

(75) Inventor: Masayuki Mitsui, Tenri (JP)

(73) Assignee: Sharp Kabushiki Kaisha, Osaka (JP)

(*) Notice: Subject to any disclaimer, the term of this patent is extended or adjusted under 35 U.S.C. 154(b) by 18 days.

(21) Appl. No.: 09/716,449

(22) Filed: Nov. 21, 2000

(30) Foreign Application Priority Data

Nov. 22, 1999 (JP) ............................................ 11-332110

(51) Int. Cl.$^7$ .............................................. G02B 27/00
(52) U.S. Cl. ........................ 385/92; 250/551; 250/239; 257/82
(58) Field of Search ................ 385/88–94, 15; 250/551, 239; 257/81, 82, 724

(56) References Cited

U.S. PATENT DOCUMENTS

| | | | | |
|---|---|---|---|---|
| 3,891,858 A | * | 6/1975 | Schoberl ..................... | 250/239 |
| 4,712,017 A | * | 12/1987 | Kamasaki ................... | 250/551 |
| 5,148,243 A | * | 9/1992 | Merrick et al. ............. | 250/239 |
| 5,545,893 A | * | 8/1996 | Brown et al. ................ | 250/239 |
| 5,770,867 A | * | 6/1998 | Sata et al. ................... | 257/787 |
| 6,177,689 B1 | * | 1/2001 | Torazawa .................... | 257/100 |
| 6,280,102 B1 | * | 8/2001 | Go .............................. | 385/94 |

FOREIGN PATENT DOCUMENTS

JP          05283734      10/1993

OTHER PUBLICATIONS

English language abstract of JP05–283734.

* cited by examiner

Primary Examiner—Hemang Sanghavi
Assistant Examiner—Scott A Knauss
(74) Attorney, Agent, or Firm—Birch, Stewart, Kolasch & Birch, LLP (57) ABSTRACT

An optical coupling device of the present invention includes: a light emitting device for converting an electric signal into an optical signal and outputting the optical signal; and a light receiving device for receiving the optical signal output from the light emitting device and converting the optical signal into the electric signal, wherein: the light emitting device has a light emitting surface for outputting the optical signal; the light receiving device has a light receiving surface for receiving the optical signal: and the light emitting device and the light receiving device are arranged so that the light emitting surface and the light receiving surface oppose each other, the optical coupling device further including: a first insulative substrate on which the light emitting device is mounted; and a second insulative substrate on which the light receiving device is mounted, wherein: the first insulative substrate has a first cross section; and the second insulative substrate has a second cross section; and at least one of the first cross section and the second cross section is substantially L-shaped.

14 Claims, 13 Drawing Sheets

Attach light receiving side substrate to light emitting side substrate

FIG. 2D

Inject transparent resin

FIG. 2E

Attach light receiving side substrate to light emitting side substrate

Make half cuts

FIG. 2F

Fill half cuts with light-blocking resin

FIG. 2G

Cut into devices

OPTICAL COUPLING DEVICE

BACKGROUND OF THE INVENTION

1. Field of the Invention

The present invention relates to an optical coupling device having a function of electrically isolating an input side and an output side from each other by converting an electrical signal into an optical signal by means of a light emitting device and converting the optical signal back into the electrical signal by means of a light receiving device.

2. Description of the Related Art

Figure 20:
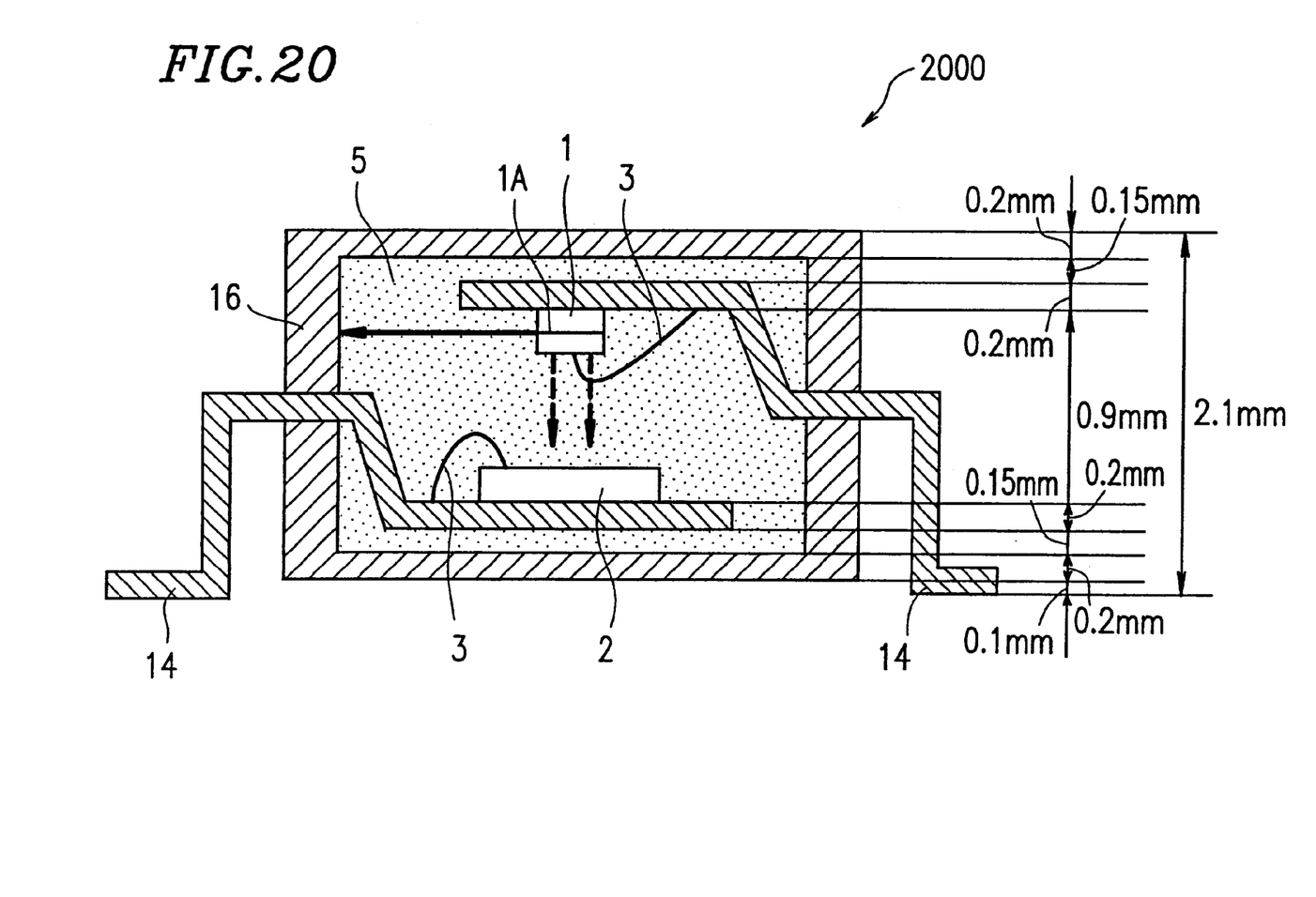
FIG. 20 is a cross-sectional view illustrating a structure of a conventional optical coupling device.

An opposed-type optical coupling device in which a light emitting device and a light receiving device are arranged to oppose each other is known in the art. FIG. 20 illustrates an optical coupling device 2000 having such a structure. The optical coupling device 2000 includes a light emitting device 1 and a light receiving device 2 which are mounted on header sections of respective lead frames 14. The light emitting device 1 and the light receiving device 2 are wire-bonded to the respective lead frames 14 via gold wire 3. The light emitting device 1, the light receiving device 2 and the lead frames 14 are molded together with a light transmissive resin 5 into a rectangular parallelepiped shape. The rectangular parallelepiped structure is further molded in a light blocking resin 16. Thus, the resulting device has a double-molded structure.

Figure 21:
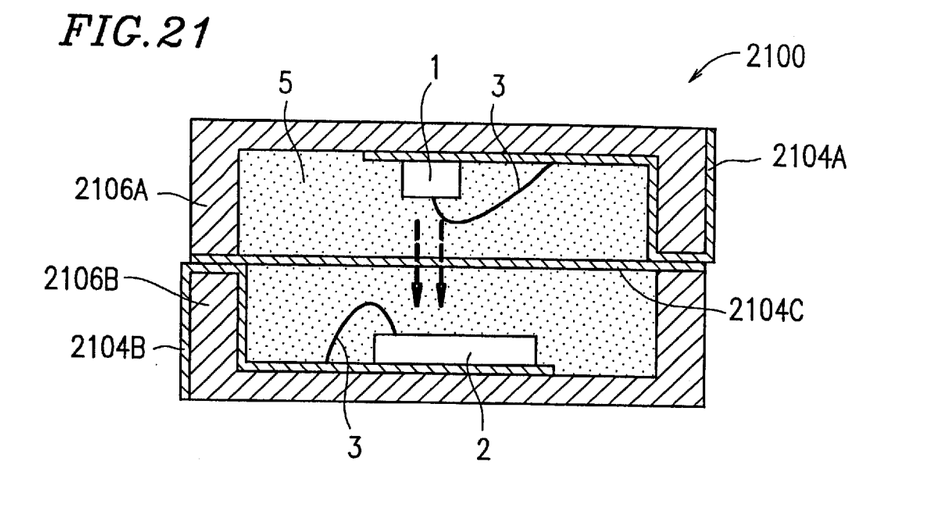
FIG. 21 is a cross-sectional view illustrating a structure of another conventional optical coupling device.

FIG. 21 illustrates a structure of another opposed-type optical coupling device 2100 known in the art. In the optical coupling device 2100, substantially U-shaped insulative substrates 2106A and 2106B are used instead of the lead frames 14. The light emitting device 1 and the light receiving device 2 are placed respectively in the substantially U-shaped insulative substrate 2106A on the light emitting side and the substantially U-shaped insulative substrate 2106B on the light receiving side. The two substantially U-shaped insulative substrates 2106A and 2106B are attached together so that the devices 1 and 2, opposing each other, are optically coupled together. Wiring patterns 2104A and 2104B are provided on the insulative substrates 2106A and 2106B for the devices 1 and 2, respectively. In FIG. 21, a line 2104C running substantially through the center of the optical coupling device 2100 denotes an adhesive with which the insulative substrates 2106A and 2106B are attached together.

Figure 22:
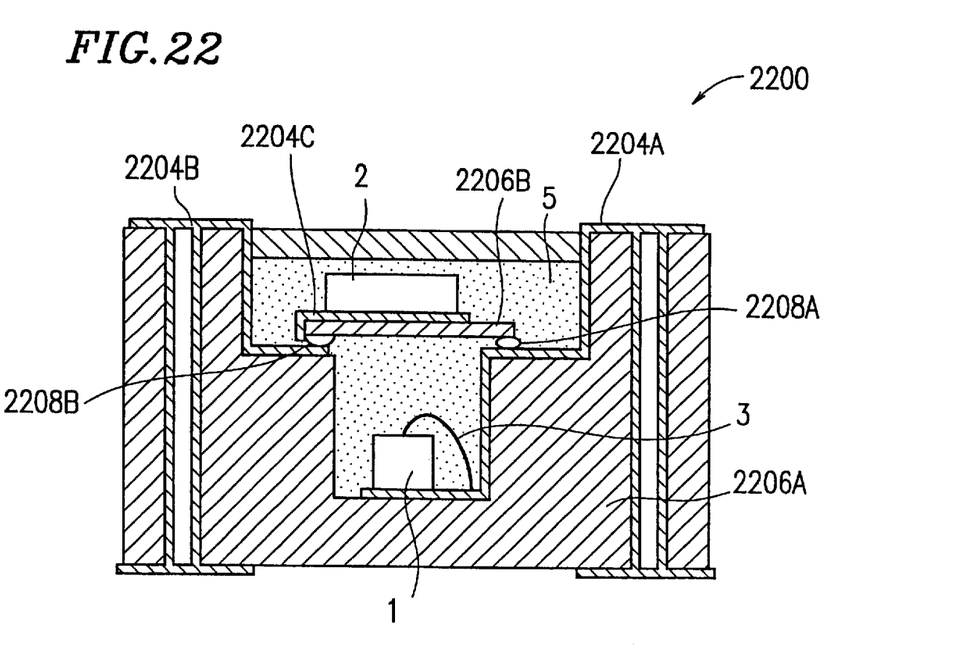
FIG. 22 is a cross-sectional view illustrating a structure of still another conventional optical coupling device.

FIG. 22 illustrates a structure of still another optical coupling device 2200 using insulative substrates. The optical coupling device 2200 includes a substantially U-shaped insulative substrate 2206A and a plate-like insulative substrate 2206B. Wiring patterns 2204A and 2204B are provided on the substantially U-shaped insulative substrate 2206A, and a wiring pattern 2204C is provided on the plate-like insulative substrate 2206B. The wiring pattern 2204A extends from an area of the substantially U-shaped insulative substrate 2206A on which the light emitting device 1 is mounted to the outside of the optical coupling device 2200, where the wiring pattern 2204A functions as a soldering section. The wiring pattern 2204B extends from the bottom of one end of the plate-like insulative substrate 2206B to the outside of the optical coupling device 2200, where the wiring pattern 2204B functions as a soldering section. The wiring pattern 2204C extends from an area of the plate-like insulative substrate 2206B where the light receiving device 2 is mounted to the bottom of one side surface of the plate-like insulative substrate 2206B. The plate-like insulative substrate 2206B is structurally connected to the wiring patterns 2204A and 2204B via solder bumps 2208A and 2208B. The solder bump 2208B electrically connects the wiring pattern 2204C to the wiring pattern 2204B.

However, when a lead frame is used in an opposed-type optical coupling device, the following problems arise. The thickness of a lead frame is 0.2 mm at minimum. For the light emitting side and the light receiving side in combination, a total thickness of 0.4 mm is required for the lead section, whereby it is difficult to reduce the overall thickness of the optical coupling device. For example, in the conventional example illustrated in FIG. 20, which employs the double-molded structure, the thickness of the optical coupling device 2000 is currently 2.1 mm at minimum.

Moreover, in the optical coupling device 2000, an electrical signal is first transferred to the light emitting side lead frame 14 and then to the light emitting device 1 mounted on the header section of the light emitting side lead frame 14. The electrical signal is converted into an optical signal at the junction plane 1A of the light emitting device 1, and then propagated to the light receiving device 2. The optical signal which has been emitted from the junction plane 1A of the light emitting device 1 toward a side surface thereof is absorbed by the light transmissive resin 5, whereby substantially no portion of the optical signal reaches the light receiving device 2. Moreover, substantially all of the optical signal which has reached the periphery of the light transmissive resin 5 is absorbed by the light blocking resin 16 and thus is not propagated to the light receiving device 2. Thus, the transmission efficiency is poor in this conventional example.

The conventional example illustrated in FIG. 21, which does not use a lead frame, is quite useful in reducing the overall thickness of the optical coupling device. However, in this structure, it is difficult to solder the wiring patterns 2104A and 2104B to the insulative substrates 2106A and 2106B, respectively, thereby complicating the production process. Moreover, the devices 1 and 2 are mounted in the substantially U-shaped insulative substrates 2106A and 2106B, respectively, which makes the die-bonding or wire-bonding process more difficult.

The conventional example illustrated in FIG. 22 is also quite useful in reducing the overall thickness of the optical coupling device. However, it is necessary to make an electrical connection between the wiring pattern 2204C of the upper, plate-like insulative substrate 2206B and the wiring pattern 2204Bon the lower, substantially U-shaped insulative substrate 2206A, thereby complicating the production process. Moreover, since the devices are mounted in the lower, substantially U-shaped insulative substrate 2206A, which makes the die-bonding or wire-bonding process more difficult.

SUMMARY OF THE INVENTION

According to one aspect of this invention, there is provided an optical coupling device, including: a light emitting device for converting an electric signal into an optical signal and outputting the optical signal; and a light receiving device for receiving the optical signal output from the light emitting device and converting the optical signal into the electric signal, wherein: the light emitting device has a light emitting surface for outputting the optical signal; the light receiving device has a light receiving surface for receiving the optical signal; and the light emitting device and the light receiving device are arranged so that the light emitting surface and the light receiving surface oppose each other, the optical coupling device further including: a first insulative substrate on which the light emitting device is mounted; and a second insulative substrate on which the light receiving device is mounted, wherein: the first insulative substrate has a first cross section; and the second insulative substrate has a second cross section; and at least one of the first cross section and the second cross section is substantially L-shaped.

In one embodiment of the invention, the first insulative substrate has a wiring pattern connected to the light emitting device; and the wiring pattern includes a soldering terminal section.

In one embodiment of the invention, the light emitting device is connected to the wiring pattern by way of wire bonding.

In one embodiment of the invention, the second insulative substrate has a wiring pattern connected to the light receiving device; and the wiring pattern includes a soldering terminal section.

In one embodiment of the invention, the light receiving device is connected to the wiring pattern by way of wire bonding.

In one embodiment of the invention, the soldering terminal section is provided on an opposite side from a leg of the substantially L-shaped cross section with respect to the light receiving device.

In one embodiment of the invention, the first insulative substrate and the second insulative substrate are molded together with a light blocking resin.

In one embodiment of the invention, the light blocking resin includes an epoxy resin.

In one embodiment of the invention, at least one of the first insulative substrate and the second insulative substrate has a protrusion which is provided along an edge of a device mount surface on which either the light emitting device or the light receiving device is mounted, the protrusion being substantially perpendicular to the device mount surface; and a side surface of the protrusion is in contact with an inner surface of the other insulative substrate.

In one embodiment of the invention, the first insulative substrate has a slope portion for reflecting the optical signal output from the light emitting device toward the light receiving device.

In one embodiment of the invention, the optical signal which has been emitted toward a side surface of the light emitting device is reflected by the slope portion toward the light receiving device.

In one embodiment of the invention, the first insulative substrate has a through hole; the first insulative substrate has a wiring pattern connected to the light emitting device; and the wiring pattern extends from an inner surface of the first insulative substrate via the through hole to an outer surface of the first insulative substrate.

In one embodiment of the invention, the second insulative substrate has a through hole: the second insulative substrate has a wiring pattern connected to the light receiving device; and the wiring pattern extends from an inner surface of the second insulative substrate via the through hole to an outer surface of the second insulative substrate.

In one embodiment of the invention, the optical coupling device further includes a light transmissive resin filled the first insulative substrate and the second insulative substrate.

In one embodiment of the invention, the light transmissive resin includes a silicone resin.

The present invention provides an opposed-type optical coupling device which employs an insulative substrate having a wiring pattern provided by plating, or the like, as a substrate on which a light emitting device and a light receiving device are mounted. In this way, it is possible to eliminate the need to use thick lead frames, thereby significantly reducing the overall thickness of the device. Moreover, the substantially L-shaped cross section of the insulative substrate facilitates the die-bonding or wire-bonding process as compared with the case where a substantially U-shaped insulative substrate as in the prior art.

Moreover, the light emitting device side insulative substrate can be provided with a light emitting side soldering terminal section (electrode), and the light receiving device side insulative substrate can be provided with a light receiving side soldering terminal section (electrode). Therefore, it is possible to eliminate the need to connect the wiring pattern on the upper substrate to the wiring pattern on the lower substrate, as in the prior art, thereby significantly improving the productivity.

The light emitting device side insulative substrate and the light receiving device side insulative substrate can be molded together with a light blocking resin. Particularly, when the junction between the light emitting device and the light receiving device has a complicated configuration, the resin molding improves the productivity. Using an adhesive can further stabilize the product quality.

Furthermore, a protrusion may be provided at the tip of the device mount surface of a substantially L-shaped structure of one insulative substrate, so that the protrusion extends in a direction substantially perpendicular to the device mount surface and that a side surface of the protrusion is in contact with an inner side surface of the other insulative substrate. In this way, it is possible to increase the creepage distance along the boundary between the periphery of the light transmissive resin structure and the inner surface of the insulative substrates, thereby increasing the withstand voltage of the optical coupling device. This is because when a high voltage is applied between the light emitting side and the light receiving side, a discharge, if any, would occur in a location where the withstand voltage is lowest, and such a location (within the optical coupling device itself excluding the ambient space) corresponds to the boundary between the periphery of the light blocking resin structure and the inner surface of the insulative substrates.

The leg (herein, the term "leg" is used to refer to the shorter one of the two linear segments of the substantially L-shaped configuration) of the substantially L-shaped cross section of the lower insulative substrate may be provided opposite from the soldering terminal section with respect to the device. In this way, it is possible to increase the creepage distance along the boundary between the periphery of the light transmissive resin structure and the inner surface of the insulative substrates, thereby increasing the withstand voltage of the optical coupling device.

The light receiving device side insulative substrate may be provided with a slope portion so that the optical signal which has been emitted toward a side surface of the light emitting device is reflected by the slope portion toward the light receiving device. In this way, it is possible to significantly improve the optical transmission efficiency.

Moreover, the insulative substrate may be provided with a through hole so that the wiring pattern can extend from the inner surface of the insulative substrate through the through hole to the outside of the optical coupling device. In this way, it is possible to increase the creepage distance along the boundary between the periphery of the light transmissive resin structure and the inner surface of the insulative substrates, i.e., the distance along such a boundary between the electrically active portion on the light emitting side and the electrically active portion on the light receiving side. Herein, the term "electrically active portion" is used to mean any portion of the light emitting side or the light receiving side which is electrically connected to the terminal of the light emitting side or the light receiving side, respectively. In the present specification, the term "electrically active portion" is used to refer to the wiring pattern itself.

Thus, the invention described herein makes possible the advantages of: (1) providing an optical coupling device capable which can be produced with a reduced thickness and an improved productivity, and in which the optical transmission efficiency can be improved.

These and other advantages of the present invention will become apparent to those skilled in the art upon reading and understanding the following detailed description with reference to the accompanying figures.

DESCRIPTION OF THE PREFERRED EMBODIMENTS

Various embodiments of the present invention will now described with reference to the accompanying drawings.

Embodiment 1

Figure 1:
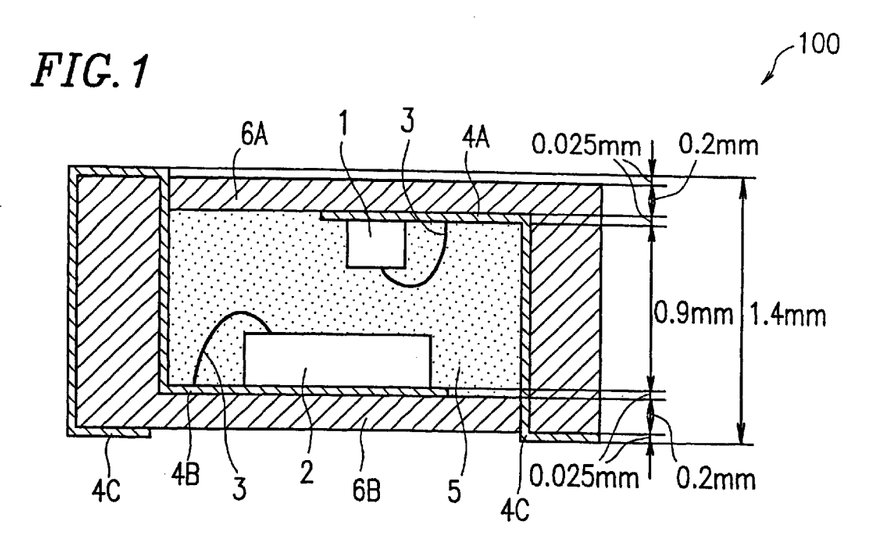
FIG. 1 is a cross-sectional view illustrating a structure of an optical coupling device according to Embodiment 1 of the present invention.

FIG. 1 is a cross-sectional view illustrating the general structure of an opposed-type optical coupling device 100 according to Embodiment 1 of the present invention. The optical coupling device 100 includes insulative substrates 6A and 6B each having a substantially L-shaped cross section. A light emitting device 1 and a light receiving device 2 are mounted on the insulative substrates 6A and 6B, respectively. The light emitting device 1 and the light receiving device 2 are wire-bonded via a gold wire 3 to respective wiring patterns 4A and 4B which are provided by plating, or the like. The insulative substrates 6A and 6B are attached together so that the devices 1 and 2 oppose each other. The inner gap between the insulative substrates 6A and 6B is filled with a light transmissive resin 5 which may be a silicone resin or an epoxy resin.

Figure 2A:
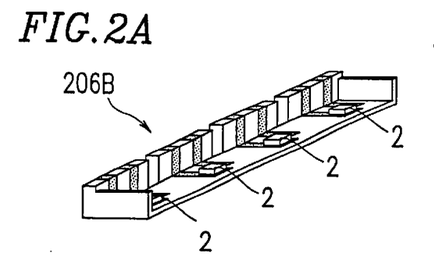
FIGS. 2A to 2H illustrates a method for producing the optical coupling device according to Embodiment 1 of the present invention.
Figure 2B:
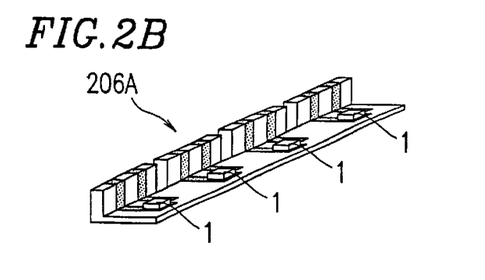
Figure 2C:
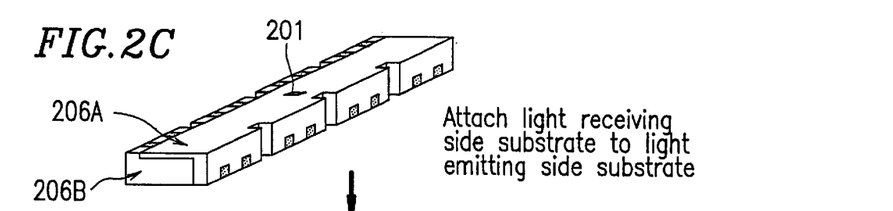
Figure 2D:
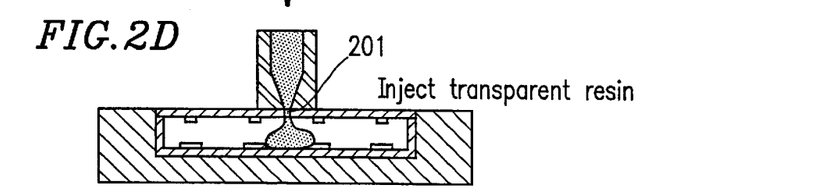
Figure 2E:
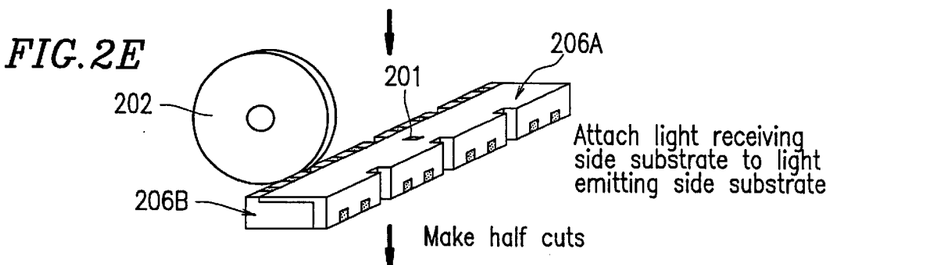
Figure 2F:
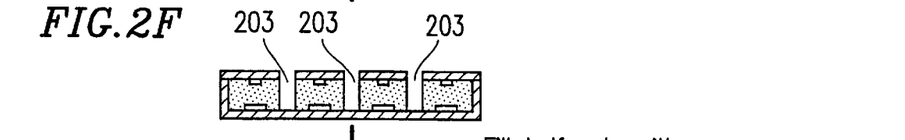
Figure 2G:
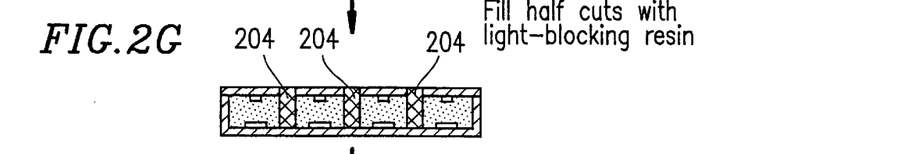
Figure 2H:
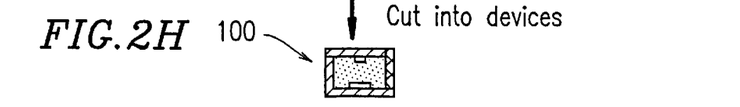

The optical coupling device 100 may be produced as follows, for example. First, a light receiving side insulative substrate 206B including a number of light receiving devices 2 mounted thereon (die-bonding or wire-bonding of the light receiving devices 2 has been completed), as illustrated in the perspective view of FIG. 2A, and a light emitting side insulative substrate 206A including a number of light emitting devices 1 mounted thereon (die-bonding or wire-bonding of the light emitting devices 1 has been completed), as illustrated in the perspective view of FIG. 2B, are provided. The insulative substrates 206A and 206B are attached together as illustrated in the perspective view of FIG. 2C. The light emitting side insulative substrate 206A has a hole 201 therein for resin injection at a position in the approximate middle between two adjacent optical coupling devices. A transparent resin is injected into the gap between the insulative substrates 206A and 206B through the hole 201, as illustrated in the cross-sectional view of FIG. 2D. Then, using a disc-shaped cutter 202, as illustrated in the perspective view of FIG. 2E, half cuts 203 are made in the obtained structure along the boundary between each pair of adjacent optical coupling devices so as to leave the lower substrate uncut, as illustrated in the cross-sectional view of FIG. 2F. During the cutting process, the resin injection hole 201 is cut away. Then, the obtained half cuts 203 are filled with a light blocking resin 204, as illustrated in the cross-sectional view of FIG. 2G, and the light blocking resin 204 is allowed to cure. Then, a disc-shaped cutter is used to sever the obtained structure into individual optical coupling devices, as illustrated in the cross-sectional view of FIG. 2H. Thus, the optical coupling device 100 is produced.

Since the optical coupling device 100 of the present embodiment which is obtained as described above employs the insulative substrates 6A and 6B which are provided with the wiring patterns 4A and 4B, respectively, there is no need to use thick lead frames. Thus, it is possible to significantly reduce the overall thickness of the optical coupling device 100 to be about 1.4 mm. Moreover, each of the insulative substrates 6A and 6B has a substantially L-shaped cross section, thereby facilitating the process of die-bonding or wire-bonding the light emitting device 1 and the light receiving device 2. Moreover, each of the insulative substrate 6A for the light emitting device 1 and the insulative substrate 6B for the light receiving device 2 can be provided with a soldering terminal section 4C, thereby eliminating the need to connect the wiring pattern on the upper substrate to the wiring pattern of the lower substrate as in the conventional examples illustrated in FIGS. 21 and 22, thereby facilitating the manufacturing process.

Alternatively, only one of the light emitting device 1 and the light receiving device 2 may have a substantially L-shaped cross section.

Embodiment 2

Figure 3:
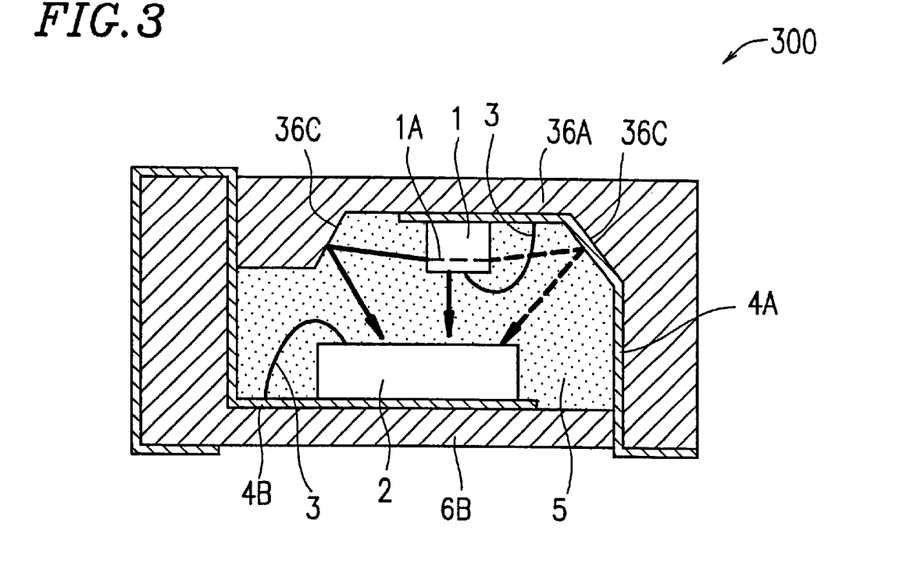
FIG. 3 is a cross-sectional view illustrating a structure of an optical coupling device according to Embodiment 2 of the present invention.

FIG. 3 is a cross-sectional view illustrating the general structure of an opposed-type optical coupling device 300 according to Embodiment 2 of the present invention. In FIG. 3, those elements which are also included in the optical coupling device 100 and shown in FIG. 1 are provided with the same reference numerals, and will not be further described below. The optical coupling device 300 has a structure similar to that of the optical coupling device 100 illustrated in FIG. 1 except that slope sections 36C are provided in a substantially L-shaped insulative substrate 36A for the light emitting device 1.

The optical signal which has been emitted from a junction plane 1A of the light emitting device 1 toward side surfaces of the light emitting device 300 is reflected by the slope sections 36C toward the light receiving device 2 so as to be received by the light receiving device 2. Thus, the optical transmission efficiency can be significantly improved.

Embodiment 3

Figure 4:
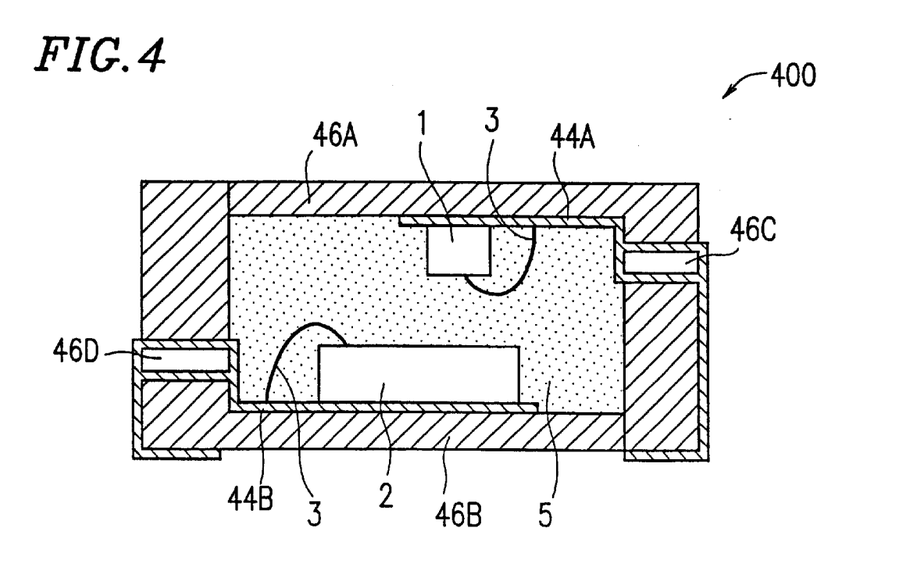
FIG. 4 is a cross-sectional view illustrating a structure of an optical coupling device according to Embodiment 3 of the present invention.

FIG. 4 is a cross-sectional view illustrating the general structure of an opposed-type optical coupling device 400 according to Embodiment 3 of the present invention. In FIG. 4, those elements which are also included in the optical coupling device 100 and shown in FIG. 1 are provided with the same reference numerals, and will not be further described below. The optical coupling device 400 has a structure similar to that of the optical coupling device 100 illustrated in FIG. 1 except that through holes 46C and 46D are provided in the substantially L-shaped insulative substrates 46A and 46B, respectively, and that wiring patterns 44A and 44B extend respectively from the inner surface of the insulative substrates 46A and 46B through the through holes 46C and 46D to the outside of the optical coupling device 400.

In this way, the wiring patterns 44A and 44B can be extended along the outer surface of the insulative substrates 46A and 46B, respectively. Thus, it is possible to increase the creepage distance along the boundary between the periphery of the light transmissive resin structure 5 and the inner surface of the insulative substrates, i.e., the distance along such a boundary between the electrically active portion on the light emitting side and the electrically active portion on the light receiving side, thereby significantly improving the withstand voltage.

Alternatively, only one of the light emitting device side and the light receiving device side may be provided with such a through hole.

Embodiment 4

Figure 5:
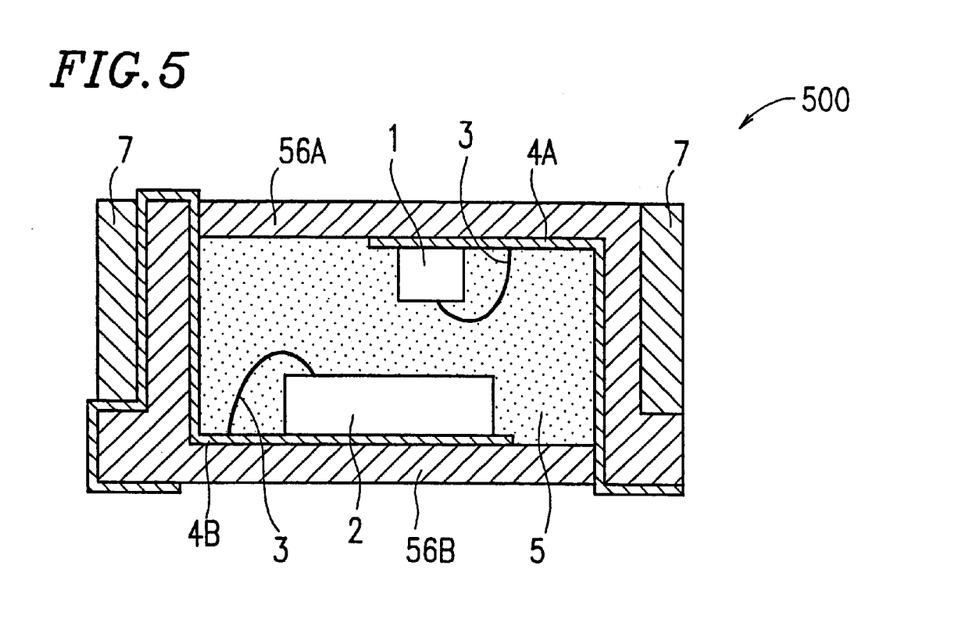
FIG. 5 is a cross-sectional view illustrating a structure of an optical coupling device according to Embodiment 4 of the present invention.

FIG. 5 is a cross-sectional view illustrating the general structure of an opposed-type optical coupling device 500 according to Embodiment 4 of the present invention. In FIG. 5, those elements which are also included in the optical coupling device 100 and shown in FIG. 1 are provided with the same reference numerals, and will not be further described below. The optical coupling device 500 has a structure similar to that of the optical coupling device 100 illustrated in FIG. 1 except that substantially L-shaped insulative substrates 56A and 56B on which the light emitting device 1 and the light receiving device 2 are mounted, respectively, are molded together with a light blocking resin 7 such as an epoxy resin.

In this way, the light emitting side and the light receiving side can be attached together without using an adhesive.

Figure 6:
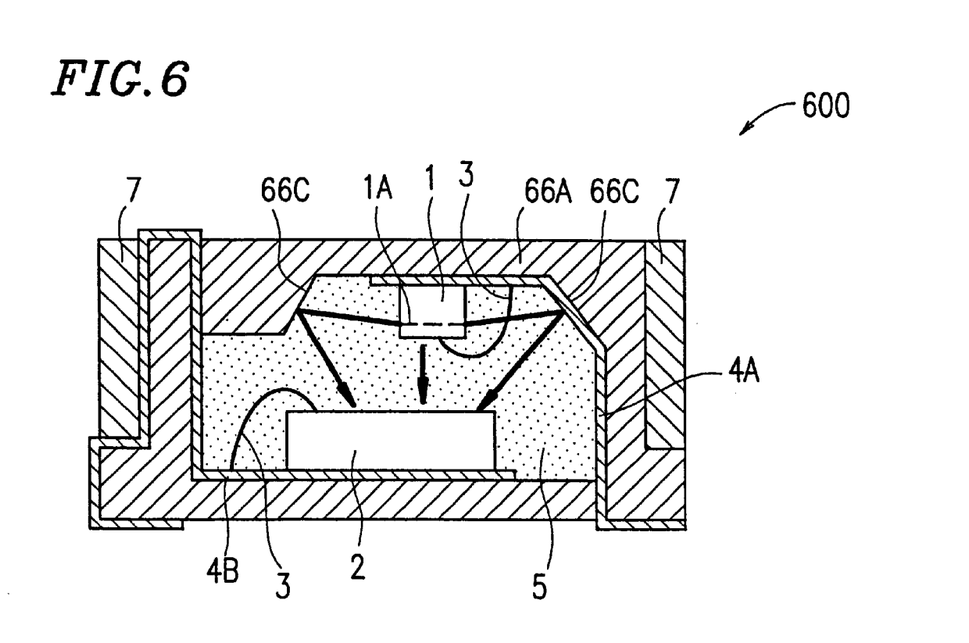
FIG. 6 is a cross-sectional view illustrating a structure of another optical coupling device according to Embodiment 4 of the present invention.

As a variation of the present embodiment, FIG. 6 illustrates an optical coupling device 600 in which an insulative substrate 66A is provided with a slope section 66C so that the optical signal which has been emitted from the junction plane 1A of the light emitting device 1 toward side surfaces of the light emitting device 600 can be reflected by the slope section 66C toward the light receiving device 2 so as to be received by the light receiving device 2.

Figure 7:
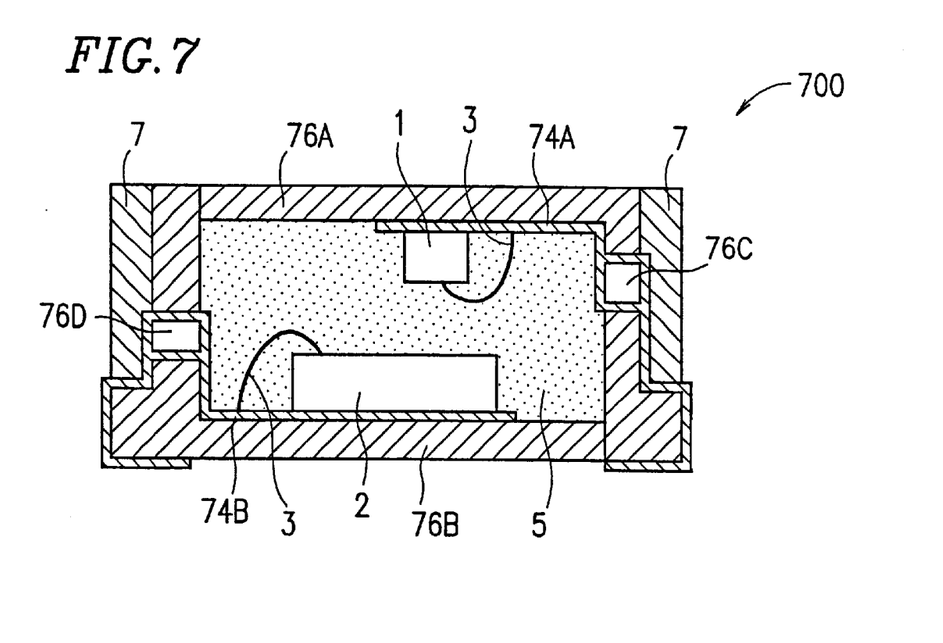
FIG. 7 is a cross-sectional view illustrating a structure of still another optical coupling device according to Embodiment 4 of the present invention.

As another variation of the present embodiment, FIG. 7 illustrates an optical coupling device 700 in which insulative substrates 76A and 76B are provided with through holes 76C and 76D, respectively, so that wiring patterns 74A and 74B can extend respectively from the inner surface of the insulative substrates 76A and 76B through the through holes 76C and 76D to the outside of the optical coupling device 700.

Embodiment 5

Figure 8:
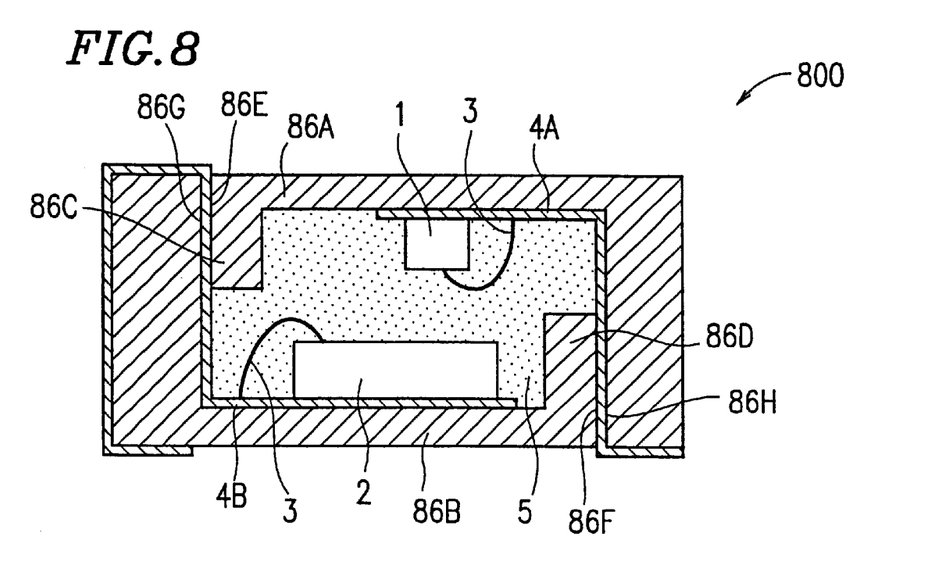
FIG. 8 is a cross-sectional view illustrating a structure of an optical coupling device according to Embodiment 5 of the present invention.

FIG. 8 is a cross-sectional view illustrating the general structure of an opposed-type optical coupling device 800 according to Embodiment 5 of the present invention. In FIG. 8, those elements which are also included in the optical coupling device 100 and shown in FIG. 1 are provided with the same reference numerals, and will not be further described below. The optical coupling device 800 has a structure similar to that of the optical coupling device 100 illustrated in FIG. 1 except that protrusions 86C and 86D are provided respectively at the tip of the device mount surfaces of the substantially L-shaped insulative substrates 86A or 86B. The protrusions 86C and 86D extend in respective directions substantially perpendicular to the device mount surfaces, and each of side surfaces 86E and 86F of the protrusions 86C and 86D of the insulative substrates 86A and 86B, respectively, is in contact with an inner side surface 86G or 86H of the other insulative substrate 86B or 86A via the wiring pattern 4B or 4A, respectively.

In this way, it is possible to increase the creepage distance along the boundary between the periphery of the light transmissive resin structure 5 and the inner surface of the insulative substrates 86A and 86B, thereby significantly increasing the withstand voltage of the optical coupling device 800.

Alternatively, only one of the light emitting device side and the light receiving device side may be provided with such a protrusion.

Figure 9:
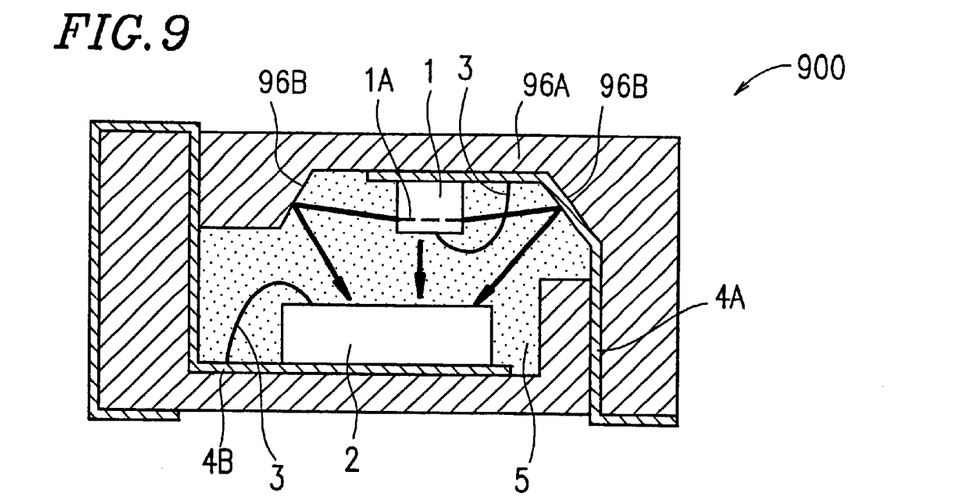
FIG. 9 is a cross-sectional view illustrating a structure of another optical coupling device according to Embodiment 5 of the present invention.
Figure 12:
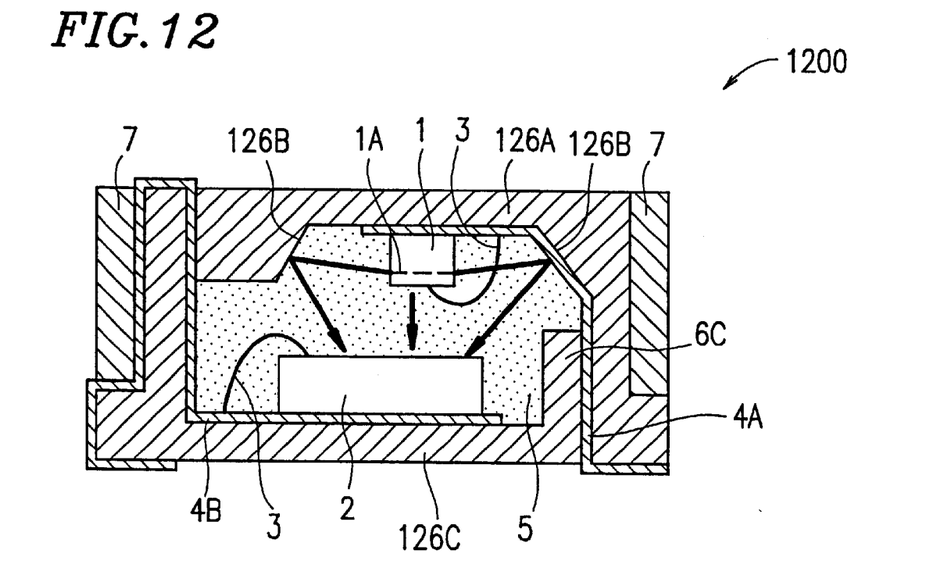
FIG. 12 is a cross-sectional view illustrating a structure of still another optical coupling device according to Embodiment 5 of the present invention.

As variations of the present embodiment, FIGS. 9 and 12 illustrate optical coupling devices 900 and 1200 in which insulative substrates 96A and 126A are provided with slope sections 96B and 126B, respectively, so that the optical signal which has been emitted from the junction plane 1A of the light emitting device 1 toward side surfaces of the light emitting devices 900 and 1200 can be reflected by the slope section 96B and 126B, respectively, toward the light receiving device 2 so as to be received by the light receiving device 2.

Figure 10:
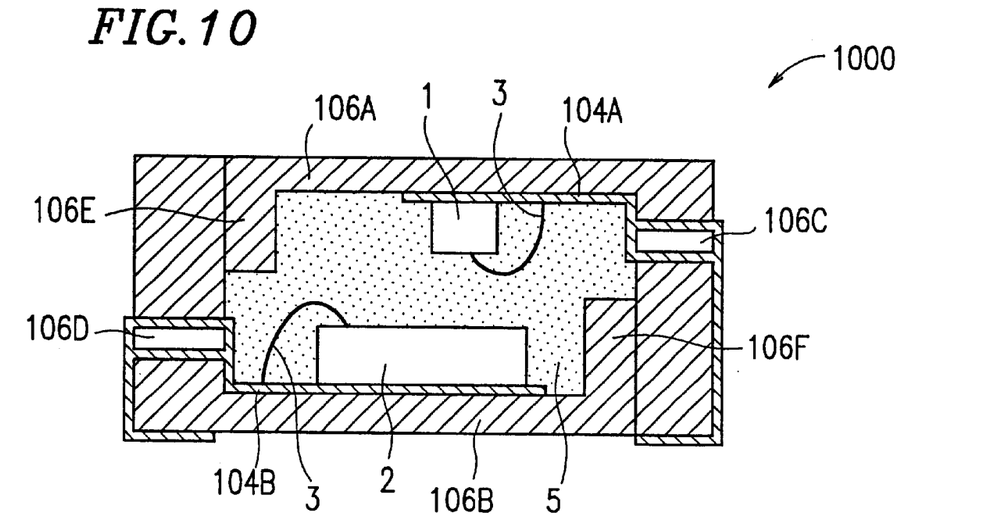
FIG. 10 is a cross-sectional view illustrating a structure of still another optical coupling device according to Embodiment 5 of the present invention.
Figure 13:
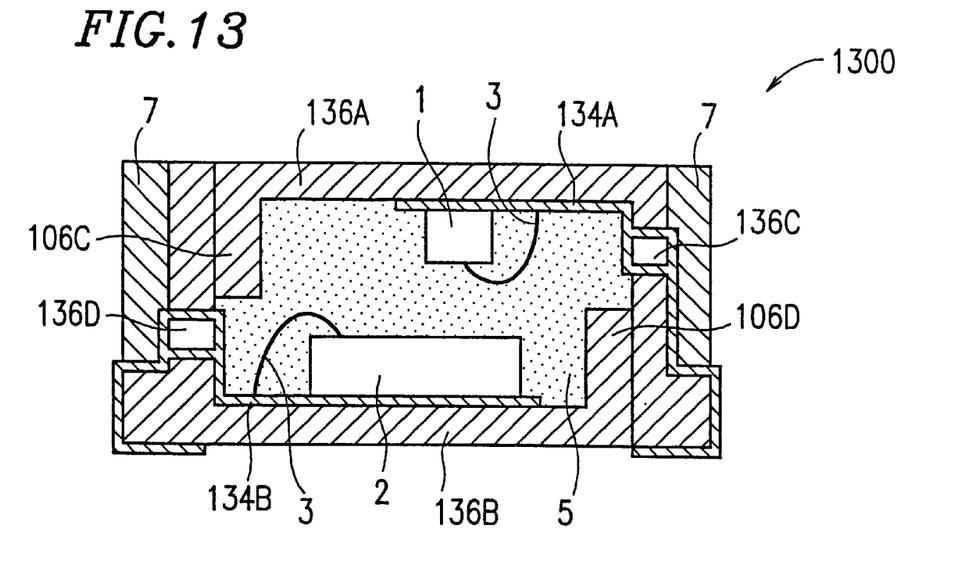
FIG. 13 is a cross-sectional view illustrating a structure of still another optical coupling device according to Embodiment 5 of the present invention.

As further variations of the present embodiment, FIGS. 10 and 13 illustrate optical coupling devices 1000 and 1300 in which insulative substrates 106A and 106B, and 136A and 136B are provided with through holes 106C and 106D, and 136C and 136D, respectively, so that wiring patterns 104A and 104B, and 134A and 134B can extend respectively from the inner surface of the insulative substrates 106A and 106B, and 136A and 136B through the through holes 106C and 106D, and 136C and 136D to the outside of the optical coupling devices 1000 and 1300, respectively.

Figure 11:
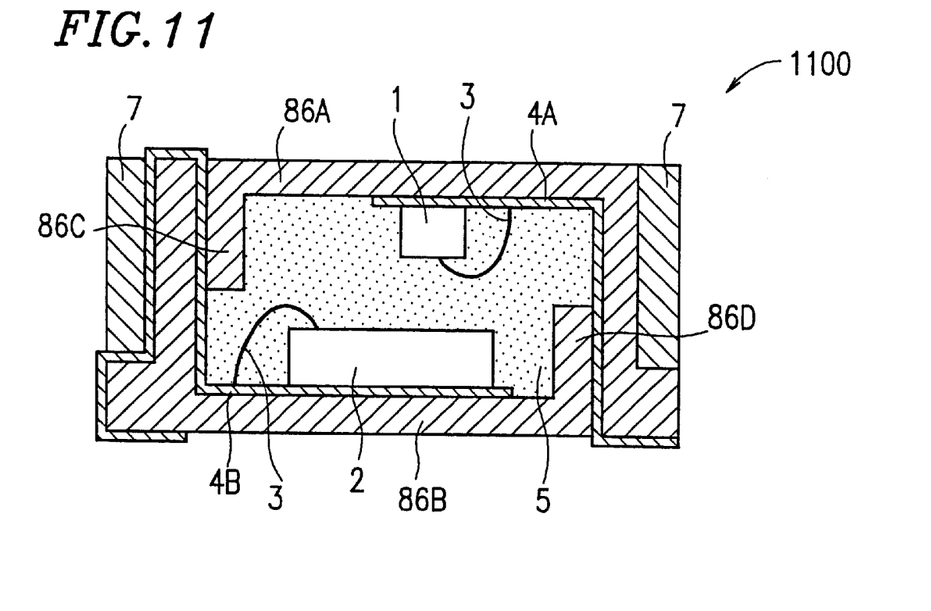
FIG. 11 is a cross-sectional view illustrating a structure of still another optical coupling device according to Embodiment 5 of the present invention.

As still other variations of the present embodiment, FIGS. 11, 12 and 13 respectively illustrate optical coupling devices 1100, 1200 and 1300 in which substantially L-shaped insulative substrates 86A and 86B, 126A and 126C, and 136A and 136B are respectively molded together with the light blocking resin 7.

Embodiment 6

Figure 14:
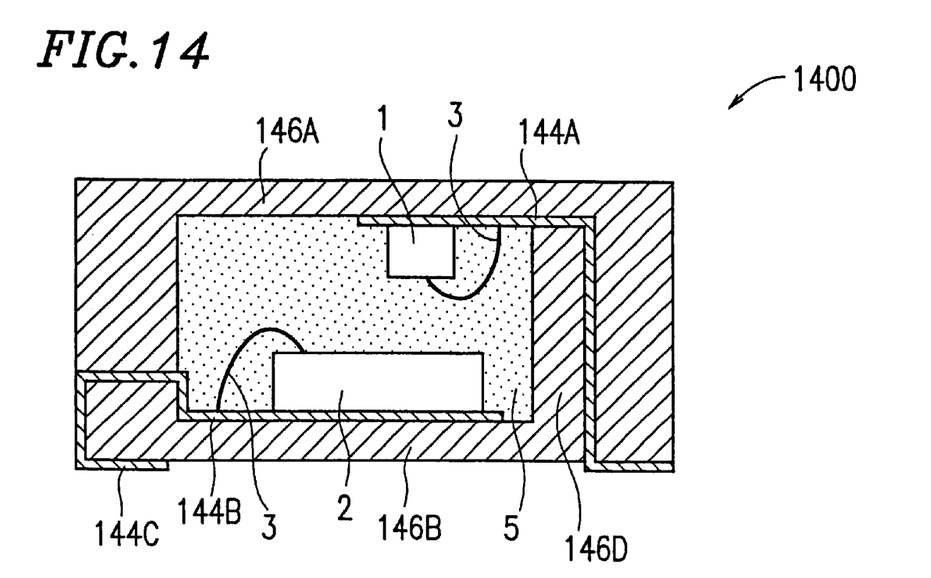
FIG. 14 is a cross-sectional view illustrating a structure of an optical coupling device according to Embodiment 6 of the present invention.

FIG. 14 is a cross-sectional view illustrating the general structure of an opposed-type optical coupling device 1400 according to Embodiment 6 of the present invention. In FIG. 14, those elements which are also included in the optical coupling device 100 and shown in FIG. 1 are provided with the same reference numerals, and will not be further described below. The optical coupling device 1400 has a structure similar to that of the optical coupling device 100 illustrated in FIG. 1 except that a leg 146D of the substantially L-shaped cross section of a lower insulative substrate 146B is provided opposite from a soldering terminal section 144B with respect to the light receiving device 2.

In this way, it is possible to increase the creepage distance along the boundary between the periphery of the light transmissive resin structure 5 and the inner surface of the insulative substrates 146A and 146B, thereby improving the withstand voltage of the optical coupling device 1400.

Figure 15:
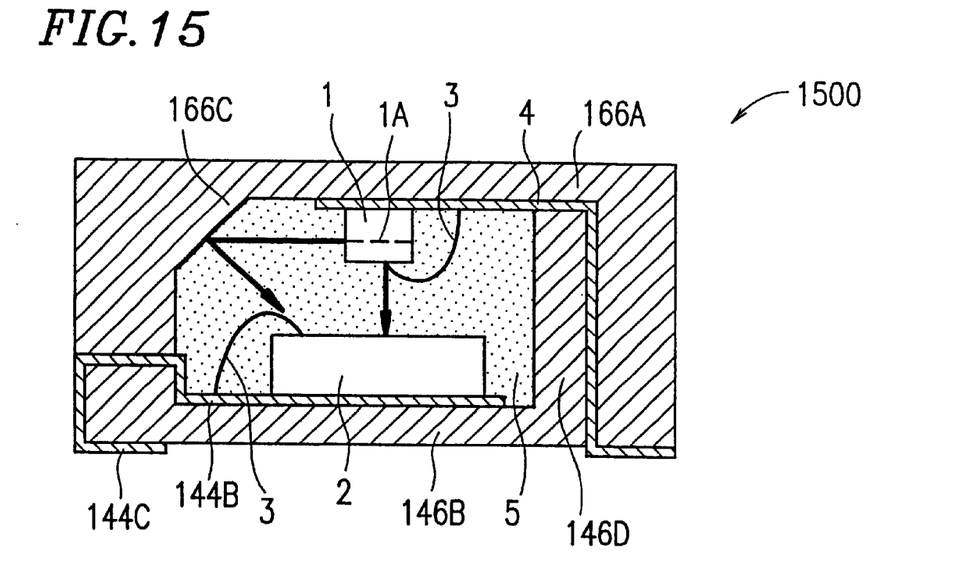
FIG. 15 is a cross-sectional view illustrating a structure of another optical coupling device according to Embodiment 6 of the present invention.
Figure 18:
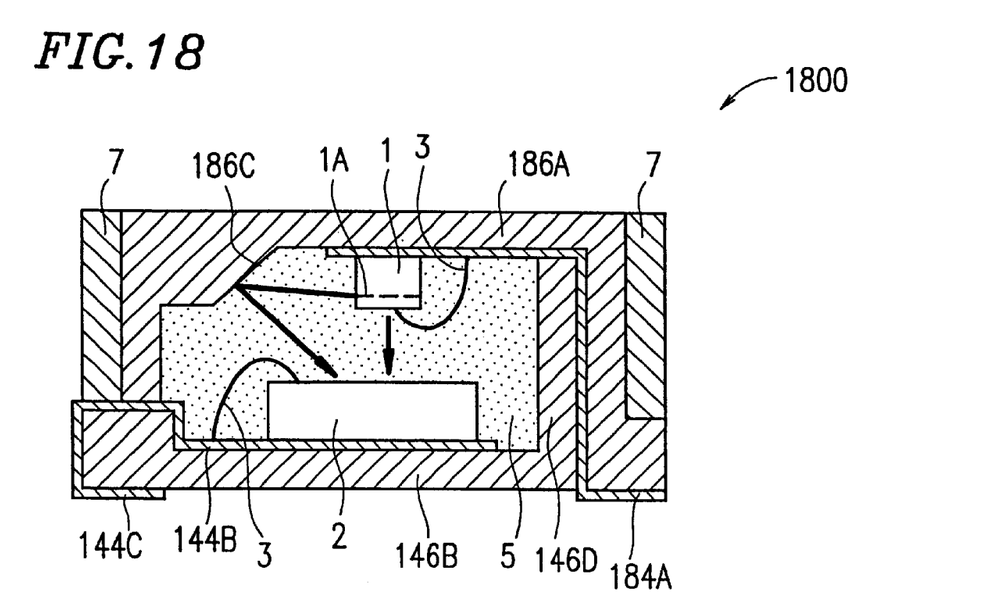
FIG. 18 is a cross-sectional view illustrating a structure of still another optical coupling device according to Embodiment 6 of the present invention.

As variations of the present embodiment, FIGS. 15 and 18 illustrate optical coupling devices 1500 and 1800 in which insulative substrates 166A and 186A are provided with slope sections 166C and 186C, respectively, so that the optical signal which has been emitted from the junction plane 1A of the light emitting device 1 toward side surfaces of the light emitting devices 1500 and 1800 can be reflected by the slope section 166C and 186C, respectively, toward the light receiving device 2 so as to be received by the light receiving device 2.

Figure 16:
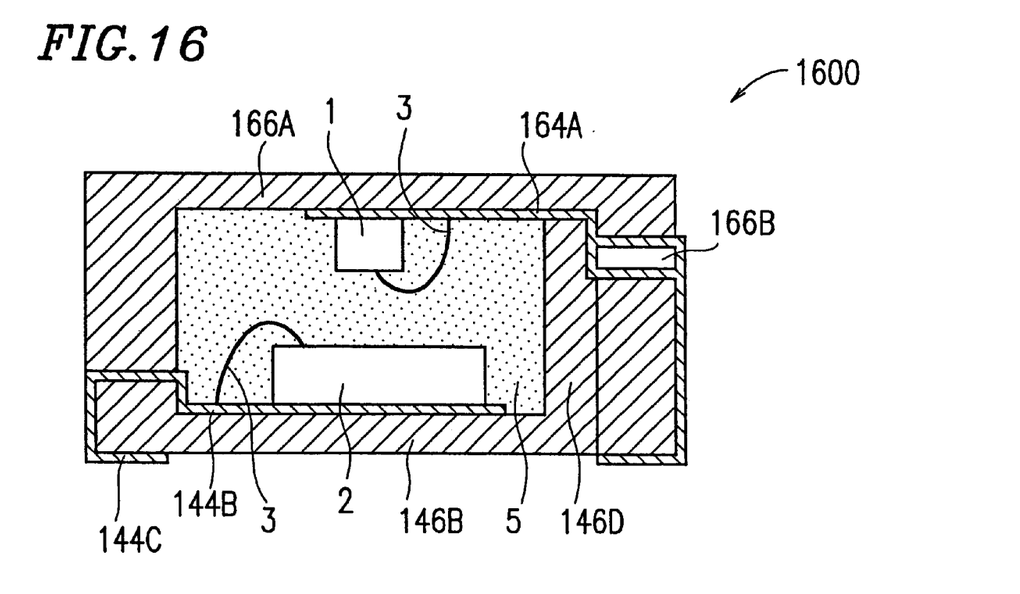
FIG. 16 is a cross-sectional view illustrating a structure of still another optical coupling device according to Embodiment 6 of the present invention.
Figure 19:
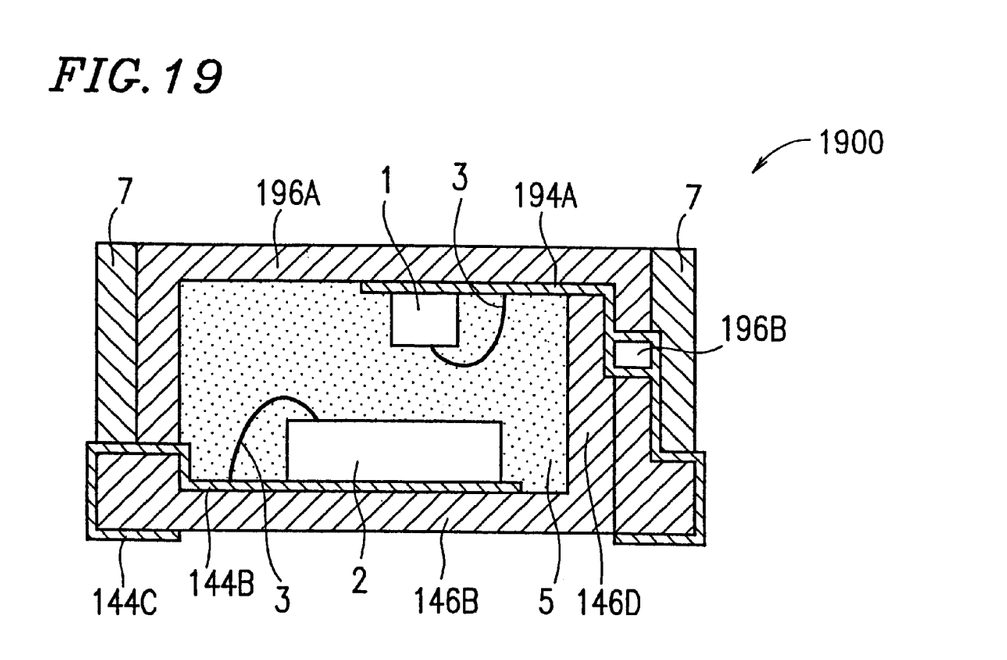
FIG. 19 is a cross-sectional view illustrating a structure of still another optical coupling device according to Embodiment 6 of the present invention.

As further variations of the present embodiment, FIGS. 16 and 19 illustrate optical coupling devices 1600 and 1900 in which insulative substrates 166A and 196A are provided with through holes 166B and 196B, respectively, so that wiring patterns 164A and 194A can extend respectively from the inner surface of the insulative substrates 166A and 196A through the through holes 166B and 196B to the outside of the optical coupling devices 1600 and 1900, respectively.

Figure 17:
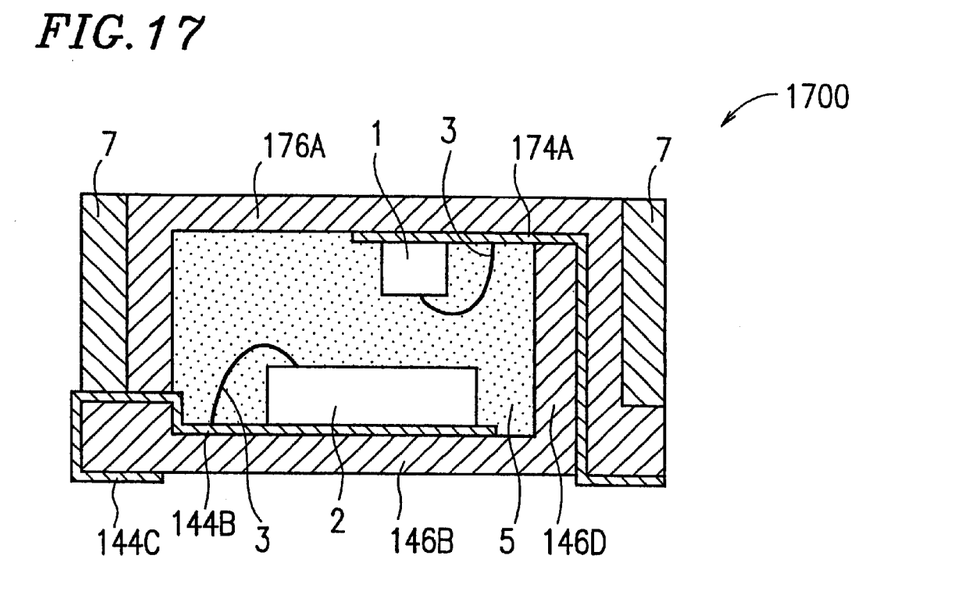
FIG. 17 is a cross-sectional view illustrating a structure of still another optical coupling device according to Embodiment 6 of the present invention.

As other variations of the present embodiment, FIGS. 17, 18 and 19 illustrate optical coupling devices 1700, 1800 and 1900 in which substantially L-shaped insulative substrates 176A and 146B, 186A and 146B, and 196A and 146B are respectively molded together with the light blocking resin 7.

In Embodiments 1–6 described above, the light emitting device 1 is mounted on the upper insulative substrate while the light receiving device 2 is mounted on the lower insulative substrate. Alternatively, the light emitting device 1 may be mounted on the lower insulative substrate while the light receiving device 2 may be mounted on the upper insulative substrate.

As described above in detail, the present invention employs a substantially L-shaped cross section for an insulative substrate of an optical coupling device. In this way, it is possible to provide a low-cost opposed-type optical coupling device, while significantly reducing the overall thickness of the optical coupling device, facilitating the die-bonding or wire-bonding process, and improving the optical transmission efficiency or the withstand voltage of the optical coupling device.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An optical coupling device, comprising:
    a first insulative substrate provided with a light emitting device thereon; and
    a second insulative substrate provided with a light receiving device thereon, and wherein:
    a portion of at least one of said first and said second insulative substrate has a substantially L-shaped cross-section, both of the light emitting device and the light receiving device are disposed within a closed region between the first and second insulative substrates, and both the first and second insulative substrates shut light out independently and provide line wiring patterns by plating on both the first and second insulative substrates, thereby the device is of a small size and thin, and
    wherein the first insulative substrate and the second insulative substrate are molded together with a light blocking resin.

2. An optical coupling device according to claim 1, wherein:
    the wiring pattern of the first insulative substrate is connected to the light emitting device; and
    the wiring pattern includes a soldering terminal section.

3. An optical coupling device according to claim 2, wherein the light emitting device is connected to the wiring pattern by way of wire bonding.

4. An optical coupling device according to claim 1, wherein:
    the wiring pattern of the second insulative substrate is connected to the light receiving device; and
    the wiring pattern includes a soldering terminal section.

5. An optical coupling device according to claim 4,
    wherein the light receiving device is connected to the wiring pattern by way of wire bonding.

6. An optical coupling device according to claim 4, wherein the soldering terminal section is provided on an opposite side from a leg of the substantially L-shaped cross section with respect to the light receiving device.

7. An optical coupling device according to claim 1, wherein the light blocking resin includes an epoxy resin.

8. An optical coupling device according to claim 1, wherein:

at least one of the first insulative substrate and the second insulative substrate has a protrusion which is provided along an edge of a device mount surface on which either the light emitting device or the light receiving device is mounted, the protrusion being substantially perpendicular to the device mount surface; and a side surface of the protrusion is in contact with an inner surface of the other insulative substrate.

9. An optical coupling device according to claim 1, wherein the first insulative substrate has a slope portion for reflecting the optical signal output from the light emitting device toward the light receiving device.

10. An optical coupling device according to claim 9, wherein the optical signal which has been emitted toward a side surface of the light emitting device is reflected by the slope portion toward the light receiving device.

11. An optical coupling device according to claim 1, wherein:

the first insulative substrate has a through hole;

the wiring pattern of the first insulative substrate is connected to the light emitting device; and the wiring pattern extends from an inner surface of the first insulative substrate via the through hole to an outer surface of the first insulative substrate.

12. An optical coupling device according to claim 1, wherein:

the second insulative substrate has a through hole;

the wiring pattern of the second insulative substrate is connected to the light receiving device; and the wiring pattern extends from an inner surface of the second insulative substrate via the through hole to an outer surface of the second insulative substrate.

13. An optical coupling device according to claim 1, further comprising a light transmissive resin filled the first insulative substrate and the second insulative substrate.

14. An optical coupling device according to claim 13, wherein the light transmissive resin includes a silicone resin.

* * * * *